July 7, 1959 C. W. VEACH ET AL 2,894,184

ELECTRICAL CHARACTERISTICS OF DIODES

Filed June 29, 1955

ROBERT L. CRONE,
CARLOS W. VEACH,
INVENTORS

BY Henry Heyman
ATTORNEY

United States Patent Office 2,894,184 Patented July 7, 1959

2,894,184

ELECTRICAL CHARACTERISTICS OF DIODES

Carlos W. Veach, Los Angeles, Calif., and Robert L. Crone, Tucson, Ariz., assignors to Hughes Aircraft Company, Culver City, Calif., a corporation of Delaware Application June 29, 1955, Serial No. 518,802

12 Claims. (Cl. 317—236)

This invention relates to semiconductor devices and more particularly to a method of improving the electrical characteristics of point contact semiconductor devices including a semiconductor crystal having a rectifying barrier therein and to such improved devices.

Monatomic semiconductors, such as germanium and silicon, have been found to be extremely useful in electrical devices for translating or controlling electromagnetic energy, such as light energy or electrical signals. In particular, these semiconductors have been utilized in the prior art for sensing light energy and for generating, amplifying and modulating electrical signals.

Basic to the theory of operation of semiconductor devices is the concept that current flow may occur in two distinctly different manners; namely, "conduction by electrons" or "excess electron conduction," and "conduction by holes" or "deficit electron conduction." The fact that electrical conductivity by both of these processes may occur simultaneously and separably in a semiconductor specimen affords a basis for explaining the electrical behavior of semiconductor devices. One manner in which the conductivity may be established is by the addition of "active" impurities to the semiconductor material.

In the semiconductor art, the term "active impurities" is used to denote those impurities which affect the electrical characteristics of a semiconductor material as distinguished from other impurities which have no appreciable effect upon these characteristics. Generally, active impurities are added intentionally to a single crystal semiconductor material for producing predetermined electrical characteristics therein.

Active impurities are classified as either donors, such as antimony, arsenic, bismuth and phosphorus, or acceptors such as indium, gallium, thallium, boron and aluminum. A region of semiconductor material containing an excess of donor impurities and yielding an excess of free electrons is considered to be an impurity-doped N-type region. An impurity-doped P-type region is one containing an excess of acceptor impurities resulting in a deficit of electron conductivity.

Electrical devices including use of monatomic semiconductor materials may be conveniently divided into two classes, namely junction type devices and point contact devices. In a point contact device one or more conductive wires or whisker elements of relatively small cross sectional area are pressed against a crystal of monatomic semiconductor material. This invention deals exclusively with such point contact devices.

In accordance with the present invention use is made of the prior art fusion method whereby a small region adjacent the point contact of a semiconductor starting specimen of one conductivity type is converted to the opposite conductivity type by doping this region with atoms of an active impurity obtained from the metallic whisker engaging the specimen. More particularly, a point of a resilient whisker including an active impurity of one type is pressed against an extrinsic or doped semiconductor crystal, including an active impurity of the other type, and an electrical forming current is passed through the whisker-crystal series combination to produce a doped region including an excess of atoms of said one active impurity type in the portion of the crystal adjacent the point, thereby changing said adjacent region to a region of the opposite conductivity type. One method for establishing a doped P-type region in a doped N-type semiconductor starting specimen, for example, is to utilize an indium-plated whisker. The indium may be plated on a conventional resilient whisker prior to use in the semiconductor device or, on the other hand, the indium may be diffused into the adjacent surface region of the whisker after being plated thereon. A detailed description disclosing this technique may be found in U.S. patent application Serial No. 306,014 entitled, "Point-Contact Semiconductor Devices and Methods of Making Same," filed August 23, 1952, by Justice N. Carman, et al.; now Patent No. 2,818,536.

The passing of the electric current through the whisker-crystal combination which is ordinarily sealed in a vitreous envelope converts the region of the specimen adjacent the whisker from N- to P-type if the starting specimen were N-type germanium and the whisker indium-doped, for example. There is thus formed a small regrown P-type region in an N-type starting crystal resulting in the formation of a rectifying junction. An exposed boundary between such P- and N-type regions at the external periphery of the junction thus created will therefore appear at the surface of the starting N-type semiconductor crystal.

When a relatively high "reverse" voltage is impressed across a diode made by the above-described method an extremely high potential gradient will be established at the above-mentioned external periphery where the exposed P–N boundary of the junction meets the surface of the starting N-type crystal.

The "reverse" voltage is so termed as it is the direction of difficult current flow or the "reverse direction" to the direction of forward current flow permitted by a diode. The high reverse or back voltage will produce a current through the diode in the back direction which is believed to comprise two distinct parts. There is first believed to be a current passing through the P–N junction which is of a relatively low order of magnitude. A second current flow, termed "leakage current" is also believed to exist at the exposed P–N boundary of the junction, and is several orders of magnitude greater than the current flow in the back direction which passes through the P–N junction. This latter phenomenon, namely the leakage current flow, has been demonstrated to be a consequence of the aforementioned high potential gradient present across the exposed boundary of the P–N junction.

If the effective distance of the minority carrier travel producing this second current flow could be increased, there would be a corresponding reduction of its magnitude.

The basic feature of the present invention is the provision of an insulating layer across the exposed boundary of the P–N junction, i.e., where the junction meets the surface of the starting crystal specimen, to prevent the aforementioned undesired conduction or leakage current along the surface of this exposed boundary.

In view of the foregoing explanation it is at once apparent that the provision of such an insulating layer would be highly desirable as it would effectively increase the distance that the minority carriers would have to travel. Difficulties arise, however, in attempting to provide a method for producing such an insulating layer in the exceedingly small packages which encase modern semiconductor devices such as diodes. An example of a modern semiconductor package of exceedingly small dimension at which the present invention is primarily directed may be found in Patent No. 2,694,168 entitled, "Glass-Sealed Semiconductor Crystal Device" by H. Q. North, et al., issued November 9, 1954. Inasmuch as the above-mentioned P–N boundary is not created until after the final seal the provision of an insulating layer obviously presents a difficult problem.

It is, therefore, an object of this invention to provide a point contact semiconductor device which has improved back voltage characteristics.

It is another object of this invention to provide a method for increasing the distance of travel in a semiconductor diode of the minority carriers comprising the leakage current in the back direction.

The present invention presents a novel method for the simultaneous establishment of an insulating layer or coating over the exposed P–N boundary which is provided by the passage of the forming current acting upon a pre-prepared and presealed semiconductor diode.

According to the basic concepts of the present invention the following steps in the preparation of the diode prior to the passage of the forming current are performed: the whisker, in addition to a coating of doping material, such as indium, has coated thereover an additional layer of germanium. The face of the crystal against which the whisker is to be pressed, after having the electrical conductor connected to the opposite face thereof, is brought into engagement with the whisker. The whisker and crystal each then have an outer coating or layer of germanium. The entire crystal assembly is then subjected to an oxidizing atmosphere, thus converting the outer surface of the germanium layer on the whisker as well as that on the surface of the crystal to germanium dioxide.

In accordance with the present invention the whisker of a semiconductor diode is provided with a germanium-dioxide layer. Therefore, when the forming current is passed through the whisker-crystal combination to form the P-type doped region the germanium-dioxide layers on the whisker and germanium crystal fuse to form one continuous coating of germanium-dioxide which acts as an insulating layer covering the exposed external periphery of the P–N junction at the surface of the crystal.

Thus the effective distance the minority carrier must travel at the exposed boundary of the P–N junction is materially increased.

According to another embodiment of the present invention a sodium metasilicate coating may be utilized to establish the electrical insulation over the converted region in place of germanium dioxide. In this embodiment of the invention the sodium metasilicate may be directly applied to the whisker or the germanium crystal, or both, by a dipping process.

A feature of this invention is the provision of a point contact semiconductor device which includes a semiconductor crystal having therein a P–N junction with the exposed external periphery of the P–N junction covered by an electrical insulator coating.

Another feature of this invention is a method for producing, in a glass-encased point-contact semiconductor device, a continuous insulator coating over the exposed external periphery of a P–N junction created by regrowing to the opposite conductivity type of a region of a semiconductor crystal of one conductivity type.

An additional feature of this invention is a method for simultaneously producing, in a glass-encased point-contact semiconductor device, a regrown region of the opposite conductivity type from that of the semiconductor starting crystal in combination with an electrical insulator coating over the exposed external periphery of the P–N junction thus formed between said regrown region and said starting crystal.

Still another feature of this invention is a method for producing, in a glass-encased semiconductor germanium device, a regrown P-type region in an N-type starting crystal and a coating of germanium dioxide over the exposed external periphery of the P–N junction thus formed between said regrown region and said starting crystal.

A still further feature of the present invention is the provision, in a glass-encased point contact semiconductor device having a P–N junction therein, of an insulator coating over the exposed external periphery of the P–N junction including sodium-metasilicate.

The novel features which are believed to be characteristic of the invention, both as to its organization and method of operation, together with further objects and advantages thereof, will be better understood from the following description considered in connection with the accompanying drawing in which the invention is illustrated by way of example. It is to be expressly understood, however, that the drawing is for the purpose of illustration and description only, and is not intended as a definition of the limits of the invention.

For the purposes of clarity, the invention will be disclosed in connection with a point-contact semiconductor device such as a crystal rectifier in which germanium is the monatomic semiconductive material and germanium dioxide is the electrical insulator coating, it being expressly understood, however, that the invention is equally applicable to the utilization of other semiconductive starting materials and other insulator coatings.

Figure 1:
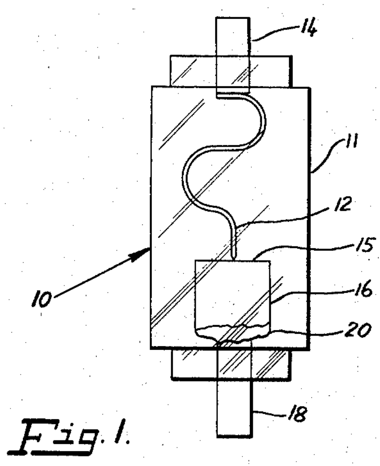
Fig. 1 is an enlarged elevational view showing a glass-encased point-contact semiconductor device in an early stage of production according to one method of the present invention.

Referring now to the drawing, wherein like reference characters designate like or corresponding parts throughout the several views, there is shown in Fig. 1 a point-contact semiconductive diode or rectifier, generally designated 10, in a preliminary state of production according to one method of this invention. While a diode is herein illustrated the present invention is equally applicable to any multi-contact device such as a transistor. Diode 10 is encased in a vitreous envelope 11 and includes two basic components, namely, a whisker 12 connected at one end thereof to its associated electrode or lead 14, and a crystal such as a germanium crystal 16 and an associated electrode 18 in ohmic contact with the crystal. Whisker 12 is composed of a metallic resilient material and includes or is doped with an active impurity of the type opposite that utilized for establishing the conductivity of germanium crystal 16. For example, if crystal 16 is composed of N-type germanium, or, in other words, includes an excess of donor atoms, whisker 12 will then include an active impurity of the acceptor type. On the other hand, if crystal 16 is composed of P-type germanium, the whisker utilized in diode 10 will include an active impurity of the donor type. Specific active impurities which may be utilized in whisker 12 and the manner in which they are included in the whisker element is described in the above referred to application to Justice N. Carman et al.

Figure 2:
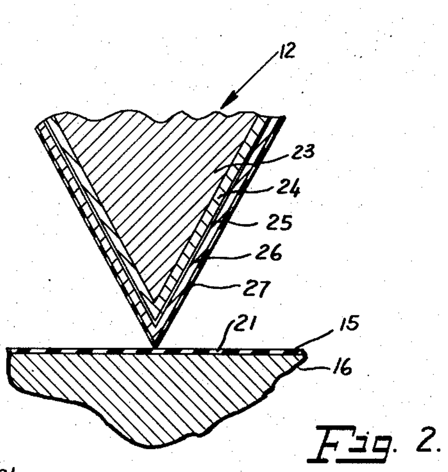
Fig. 2 is an enlarged view in cross section of a whisker-crystal combination in Fig. 1.

Whisker 12 of diode 10 is now moved into engagement with crystal 16. No treatment other than that hereinabove referred to is applied to crystal 16 as the crystal will have formed thereon a germanium-dioxide coating 21 on surface 15 merely by being exposed to the atmosphere as best seen in Fig. 2; this is so because germanium has a great affinity for oxygen.

Crystal 16 is preferably a single crystal of germanium and includes an active impurity of either the acceptor or donor type. In other words, crystal 16 may be either P-type or N-type germanium.

Crystal 16 may be ohmically connected to its associated electrode 18 in any conventional manner known to the art, when an ohmic connection is desired. As shown in Fig. 1, for example, electrode 18 is connected to crystal 16 by solder 20. In addition, crystal 16 preferably has been etched in any conventional manner known to the art.

One end of whisker 12 is preferably spot-welded to its associated lead 14 substantially as shown. The other end of whisker 12 is ground or cut to a point and is positioned adjacent the upper surface 15 of crystal 16, as viewed in Fig. 1 prior to the establishment of the point-contact between the crystal and whisker. In addition, whisker 12 is preferably formed to have a configuration which imparts greater spring-like characteristics or resilience to the whisker element. Although shown in Fig. 1 to be substantially S-shaped, it is to be understood that the whisker element may have any other conventional configuration known to the art.

In Fig. 2 the cross sectional view of the point contact at the end of whisker 12 is shown to be in engagement with a germanium dioxide coating 21 on the surface 15 of crystal 16. Whisker 12 may, for example, comprise a molybdenum wire 23 which has coated thereon a layer of indium 24. The deposit or production of indium coating 24 may be by any method known to the art with one specific method being described in the previously referred to U.S. patent application by Justice J. Carman, et al. The indium coating 24 is exposed to the atmosphere thereby producing an indium oxide coating 25 over the indium coating 24. Subsequent to the application of the indium coating 24 a germanium layer 26 is evaporated onto surface 25, or produced by any other conventional method. As previously explained with respect to crystal 16, since germanium has a great affinity for oxygen there will be produced a germanium dioxide coating 27 on the outer surface of germanium coating 26.

Figures 3, 4, 5:
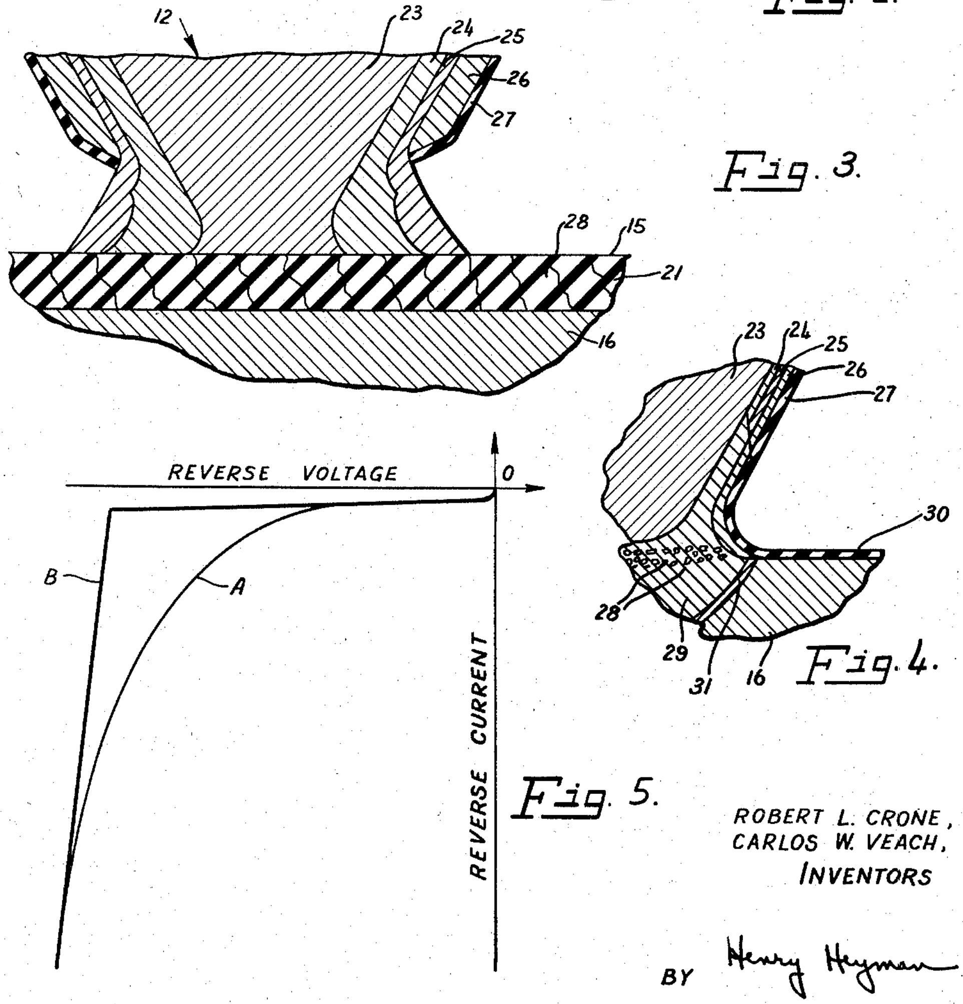
Fig. 3 is a greatly enlarged cross-sectional view of the whisker and crystal after the whisker has been forced down on the surface of the semiconductor crystal.
Fig. 4 is an enlarged cross-sectional view of a portion of the whisker and crystal of Fig. 3 after forming.
Fig. 5 is a graph showing the reverse current as a function of peak inverse voltage of the device of Figs. 1–4.

As whisker 12 is pressed against germanium dioxide coating 21 on surface 15 of crystal 16 by diode assembly apparatus, not shown, the pointed end of whisker 12 will be flattened and a section 28 of the germanium dioxide coating 21 will become fractured in a manner shown in Fig. 3.

An electric forming current is then passed through the whisker 12 and crystal 16 producing a regrown doped P-type region 31 in N-type crystal 16 in the area adjacent the point contact established between whisker 12 and crystal 16 as shown in Fig. 4.

There is some question as to the precise nature of the phenomenon which occurs at the point contact during the electrical forming operation. According to one theory, it is believed that the heat dissipated by the forming current melts a relatively small portion of the whisker point, including the indium therein. The molten tip of the whisker, in turn, melts or dissolves the region of the germanium crystal 16 immediately adjacent the contact area, thereby permitting indium atoms from the whisker 12 to fuse with the molten region of the germanium and convert this region to an acceptor impurity-doped P-type region 31 in N-type crystal 16. Concurrently with the dissolution of indium, the germanium-dioxide 21 and 27 formed during oxidation of the encased crystal 16 will form a continuous protective insulator layer 30 over the exposed boundary between the thus created doped P-type region 31 and the N-type starting crystal 16 as may be best seen in Fig. 4.

As shown in Fig. 4 a non-uniform alloy indicated at 29 and including germanium, indium and molybdenum will have included therein particles of fractured germanium dioxide 28.

While the foregoing method has been described in connection with the formation of an insulator coating of germanium-dioxide, it has been found that silicates are equally effective to increase the peak inverse voltage characteristics of point-contact semiconductor devices thus manufactured, or stated differently, will reduce the reverse leakage current.

Of course, if the entire insulator coating is to be formed by depending on an insulator coating on whisker 12 of a silicate such as sodium-metasilicate, the silicate already being an insulator need not be oxidized as would the germanium to effectively become an insulator. It should be noted in passing that the silicate can be effectively used so as to reduce the leakage current by only coating the whisker 12, whereby a merger between the germanium dioxide coating produced on the crystal 16 and the silicate coating applied to whisker 12 is effected by the heat due to the energy released by the passage of the forming current.

Alternately a more uniform silicate coating may be realized if the silicate is applied to both the crystal and the whisker before the forming operation.

Curves A and B in Fig. 5 were experimentally obtained and verified to show how the leakage current is effectively reduced by the provision of an insulator coating over the exposed external periphery of the P–N junction. Curve A shows the reverse current as a function of reverse voltage when no insulator coating has been provided while curve B indicates the improvement which can be obtained in such characteristic by the introduction of an insulator coating in accordance with this invention.

There has thus been disclosed a new and novel method for the production of an insulator coating over a regrown region of one conductivity type in a semiconductor starting crystal of the opposite conductivity type to impede the conduction of current in the back direction when a high peak inverse voltage is applied to a diode.

There has also been disclosed a new and novel device which has an exceedingly low leakage current due to a lengthened path of travel for the minority carriers in the back direction.

What is claimed is:

1. A semiconductor device of the point contact type comprising: a germanium crystal of one conductivity type having a doped region of the opposite conductivity type in a first face thereof; a whisker element doped with an active impurity of the conductivity type of said doped region and being welded at one end thereof to said doped region; and a continuous coating of germanium dioxide extending over and surrounding said doped region and said welded one end of said whisker.

2. A semiconductor device of the point-contact type comprising: a germanium crystal of N-type conductivity having a doped P-type region in a first face thereof; a whisker element coated with indium, and having an outer coating of germanium dioxide, said whisker element being welded at one end thereof to said doped region; and a continuous coating of germanium dioxide extending over said first face of said germanium crystal and merging with said germanium dioxide coating of said whisker element.

3. In a point contact semiconductor device of the type comprising a whisker element in contact with a semiconductor crystal of predetermined conductivity type and wherein a doped region of a conductivity type opposite that of said crystal is provided in said crystal adjacent and surrounding the contact area thereof with said whisker element, a whisker element comprising a resilient metal doped with an impurity type which will produce said opposite conductivity type, said whisker element being provided with an outer layer of germanium dioxide upon at least that portion contacting said semiconductor crystal.

4. In a point contact semiconductor device of the type comprising a whisker element in contact with an N-type semiconductor crystal and wherein a doped P-type region is provided in said crystal adjacent and surrounding the contact area thereof with said whisker element, a whisker element comprising a resilient metal doped with a P-type impurity, said whisker element being provided with an outer layer of germanium dioxide upon at least that portion contacting said N-type semiconductor crystal.

5. In a point contact semiconductor device of the type comprising a whisker element in contact with an N-type semiconductor crystal and wherein a doped P-type region is provided in said crystal adjacent and surrounding the contact area thereof with said whisker element, a whisker element comprising a resilient metal of filamentary shape, a first layer of indium provided over said resilient metal, a first coating of indium oxide provided over said first layer, a second layer of germanium provided over said first coating, and a second coating of germanium dioxide provided on said second layer each layer and coating being upon and surrounding at least that portion of said whisker element which is in contact with said N-type semiconductor crystal.

6. The method of producing an electrical insulator coating over a semiconductor crystal of one conductivity type in a region where a whisker element doped with an active impurity of a conductivity type opposite from that of said crystal makes point contact with a face of said crystal, said method including the steps of: coating the whisker element with a layer of electrical insulating material the insulating characteristics of which will not be affected by momentary subjection to the high temperatures required in welding; contacting one end of said whisker with said region of said crystal; and passing an electric forming current through said whisker element and said crystal whereby a continuous insulating layer is produced extending over and surrounding said region.

7. The method of producing a coating of germanium dioxide surrounding an N-type germanium crystal in the vicinity where a doped P-type whisker element makes point contact with a face of said crystal including the steps of: coating the whisker element with a layer of germanium; exposing said whisker element and said germanium crystal to an oxidizing atmosphere to form a germanium dioxide coating on said whisker element and on said crystal; passing a forming current through said whisker element and said crystal, whereby the heat generated by said forming current provides a continuous insulating layer of germanium dioxide over and surrounding said P-type region by the merger of the germanium dioxide coatings on said whisker element and on said germanium crystal.

8. In a point contact semiconductor device comprising a whisker element consisting essentially of a resilient metal containing an acceptor impurity and an N-type germanium crystal in point contact with said whisker element, wherein a doped P-type region is produced in said N-type crystal adjacent the point contact, the method of producing a continuous insulating layer over and surrounding said doped P-type region simultaneously with the production of said doped P-type region including the steps of: coating the whisker element with a layer of germanium; exposing said whisker element and said germanium crystal to an oxidizing atmosphere to form a germanium dioxide layer on said whisker element and said crystal; and passing an electric forming current through said crystal and point contact to melt a portion of said resilient point contact and dissolve a portion of said N-type crystal at said region adjacent the point contact, whereby a continuous insulating layer of germanium dioxide is produced over and surrounding said P-type region by the germanium dioxide coatings on said whisker element and on said germanium crystal being fused together by the heat generated by the passage of said forming current.

9. In a point contact semiconductor device comprising a whisker element consisting essentially of a resilient metal and a semiconductor crystal of one conductivity type in point contact with said whisker element, said semiconductor crystal having a germanium dioxide coating on one face thereof, and having a doped region of the opposite conductivity type in the vicinity where the point contact makes engagement with the one face of said crystal, the method of producing a continuous insulating layer over and surrounding said doped region simultaneously with the production of said doped region including the steps of: coating the whisker element with a layer of germanium; exposing said whisker element to an oxiding atmosphere to form a germanium dioxide layer on said whisker element; and passing an electric forming current through said crystal and point contact to melt a portion of said resilient whisker element and dissolve a portion of said germanium crystal in the vicinity where the point contact makes engagement with the one face thereof whereby a continuous insulating layer of germanium dioxide is produced over and surrounding said doped region by the germanium dioxide coatings on said whisker element and on said germanium crystal being merged by the heat generated by the passage of said forming current.

10. The method of producing an electrical insulator coating over a semiconductor crystal of one conductivity type in a region where a whisker element doped with an active impurity of a conductivity type opposite that of said crystal makes point contact with a face of said crystal, said method including the steps of: coating the whisker element with a layer of sodium-metasilicate; and passing an electric forming current through said whisker element and said crystal, whereby a continuous insulating layer of sodium-metasilicate is produced extending over and surrounding said doped region.

11. The method of producing an electrical insulator coating over a germanium crystal of one conductivity type in a region where a whisker element doped with an active impurity of a conducitivity type opposite that of said crystal makes point contact with a face of said crystal, said method including the steps of: exposing said germanium crystal to an oxidizing atmosphere to form a germanium dioxide coating on said face of said crystal; coating the whisker element with a layer of sodium-metasilicate, and passing an electric forming current through said whisker element and said crystal, whereby a continuous insulating layer is produced extending over and surrounding said region.

12. In a point contact semiconductor device of the type comprising a whisker element in contact with a P-type semiconductor crystal and wherein a doped N-type region is provided in said crystal adjacent and surrounding the contact area thereof with said whisker element, a whisker element comprising a resilient metal doped with an N-type impurity, said whisker element being provided with an outer layer of germanium dioxide upon at least that portion contacting said P-type semiconductor crystal.

References Cited in the file of this patent

UNITED STATES PATENTS

| | | |
|---|---|---|
| 2,588,956 | Brittain et al. | Mar. 11, 1952 |
| 2,671,156 | Douglas et al. | Mar. 2, 1954 |
| 2,704,818 | North | Mar. 22, 1955 |
| 2,705,768 | Kleimack et al. | Apr. 5, 1955 |
| 2,712,132 | Mathews et al. | July 12, 1955 |
| 2,717,343 | Hall | Sept. 6, 1955 |
| 2,736,822 | Dunlap | Feb. 28, 1956 |
| 2,736,847 | Barnes | Feb. 28, 1956 |
| 2,795,743 | Lehovec | June 11, 1957 |
| 2,798,189 | Alexander | July 2, 1957 |